US008217821B2

(12) United States Patent
David et al.

(10) Patent No.: US 8,217,821 B2
(45) Date of Patent: Jul. 10, 2012

(54) REFERENCE SIGNAL GENERATOR CIRCUIT FOR AN ANALOG-TO-DIGITAL CONVERTER OF A MICROELECTROMECHANICAL ACOUSTIC TRANSDUCER, AND CORRESPONDING METHOD

(75) Inventors: Filippo David, Milan (IT); Igino Padovani, Novate Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/821,022

(22) Filed: Jun. 22, 2010

(65) Prior Publication Data

US 2010/0321103 A1 Dec. 23, 2010

(30) Foreign Application Priority Data

Jun. 23, 2009 (IT) .............................. TO2009A0482

(51) Int. Cl.
*H03M 1/12* (2006.01)

(52) U.S. Cl. ........ 341/155; 341/118; 341/120; 341/143; 323/268; 323/277; 323/313; 327/271; 327/282; 327/285; 327/312

(58) Field of Classification Search .................. 341/118, 341/120, 143, 155; 323/268, 182, 313, 277; 327/271, 282, 285, 286, 312–317, 538, 539
See application file for complete search history.

(56) References Cited

U.S. PATENT DOCUMENTS 4,350,975 A * 9/1982 Haque et al. .................. 341/108
5,784,053 A * 7/1998 Ishikawa et al. .............. 345/174
7,009,545 B2 * 3/2006 Cho et al. ...................... 341/155
7,362,081 B1 * 4/2008 Huang .......................... 323/282
7,768,272 B2 * 8/2010 Kato et al. .................... 324/672
7,855,472 B2 * 12/2010 Hjort et al. ...................... 307/66
2002/0130645 A1 * 9/2002 Tsai et al. ..................... 323/274
2005/0030209 A1 * 2/2005 Lee .............................. 341/120
2005/0110670 A1 * 5/2005 Cho et al. ...................... 341/158
2006/0103365 A1 * 5/2006 Ben-Yaacov ................ 323/313
2007/0115061 A1 5/2007 Su et al.
2008/0224759 A1 9/2008 Marinca
2009/0243392 A1 * 10/2009 Huang ............................ 307/75
2009/0305747 A1 * 12/2009 Groeneweg ................... 455/572
2010/0225517 A1 * 9/2010 Aiba ............................. 341/143

FOREIGN PATENT DOCUMENTS

EP 0329245 A1 8/1989
WO 99/56387 A1 11/1999
WO 00/42483 A1 7/2000

OTHER PUBLICATIONS

A,J. Lopez-Martin, et al. "Low-Voltage Super Class AB CMOS OTA Cells With Very High Slew Rate and Power Efficiency," IEEE Journal of Solid-State Circuits, May 2005, pp. 1068-1077, vol. 40, No. 5.

* cited by examiner

*Primary Examiner* — Linh Nguyen
(74) *Attorney, Agent, or Firm* — Seed IP Law Group PLLC

(57) ABSTRACT

A reference signal generator circuit for an analog-to-digital converter, the circuit having a signal-generation stage to generate a first reference signal on a first reference terminal, and a filtering circuit arranged between the generator stage and the analog-to-digital converter to determine a filtering of disturbance present on the first reference signal and supply at output on a second reference terminal a second filtered reference signal, the filtering circuit having a switching circuit to connect the first reference terminal to the second reference terminal directly during startup of the reference signal generator circuit and then through the filtering circuit once the startup step is terminated.

18 Claims, 6 Drawing Sheets

REFERENCE SIGNAL GENERATOR CIRCUIT FOR AN ANALOG-TO-DIGITAL CONVERTER OF A MICROELECTROMECHANICAL ACOUSTIC TRANSDUCER, AND CORRESPONDING METHOD

BACKGROUND

1. Technical Field

The present disclosure relates to a reference signal generator circuit for an analog-to-digital converter, in particular of an acoustic transducer, for example a MEMS (microelectromechanical system) capacitive microphone, to which the ensuing description will make explicit reference without implying any loss of generality; the present disclosure moreover relates to a method for generating the reference signal.

2. Description of the Related Art

As is known, an acoustic transducer of a capacitive type, for example, a MEMS microphone, generally includes a mobile electrode, provided as diaphragm or membrane, set facing a fixed electrode, to provide the plates of a variable-capacitance detection capacitor. The mobile electrode is generally anchored by means of a perimetral portion thereof to a substrate, whilst a central portion thereof is free to move or bend in response to the pressure exerted by incident sound waves. The mobile electrode and the fixed electrode form a capacitor, and bending of the membrane that constitutes the mobile electrode causes a variation of capacitance of the capacitor. In use, the variation of capacitance, which is a function of the acoustic signal to be detected, is transformed into an analog electrical signal that is supplied as output signal of the acoustic transducer.

The analog electrical signal is generally converted into a digital signal so as to be appropriately processed. The operation of conversion is performed by means of an analog-to-digital (A/D) converter and is based, as is known, upon the comparison of the analog electrical signal at an input to the A/D converter with a reference voltage signal $V_{REF}$, generated by an appropriate circuit external to the A/D converter and supplied on an input terminal of the latter.

The resolution with which the analog-to-digital converter carries out the operation of conversion is strictly dependent upon the noise superimposed on the reference signal $V_{REF}$. It is hence fundamental, in order to guarantee a high signal-to-noise ratio, to have available a reference voltage $V_{REF}$ with low noise.

To overcome the limitation, a circuit solution has been proposed, illustrated in FIG. 1, in which a lowpass filter 1, in RC configuration, is connected to an output of the reference signal generator circuit 2 via an input terminal 3 of its own, and to an input of the analog-to-digital converter 4 via an output terminal 5 of its own, and has the function of filtering the reference signal $V_{REF}$ so as to attenuate the noise components thereof.

In particular, the lowpass filter 1 is provided with a filter resistor 6, connected between the input terminal 3 and the output terminal 5, and a filter capacitor 8 connected between the output terminal 5 and a ground terminal GND.

It has, however, been shown that, in order for the action of lowpass filtering to be effective, it is convenient for the lowpass filter 1 to present a pole at a frequency lower than the audio band (indicatively included between 20 Hz and 20 kHz), preferably a frequency equal to or lower than 1 Hz.

For this purpose, filter capacitors 8 are generally used, which have a high value of capacitance (for example, in the 100 nF-10 μF range) and, typically, cannot be integrated, as described, for example, in US 2008/0224759.

Alternatively, it is possible to use extremely high values of resistance of the filter resistor 6, included, for example, between 100 GΩ and 100 TΩ.

As is known, since it is not feasible in the technology of integrated circuits to produce resistors with such high values of resistance, use of nonlinear devices able to provide the high values of resistance required has been proposed. For example, there has been proposed for this purpose the use of a pair of diodes in antiparallel configuration, which provide a resistance sufficiently high when there is a voltage drop thereon of contained value (depending upon the technology of fabrication of the diodes, for example less than 100 mV).

As illustrated in FIG. 2, the filter resistor 6 can hence be provided by a respective pair of diodes in antiparallel configuration.

In particular, the filter resistor 6 is provided by a first diode 6*a*, with its anode connected to the input terminal 3 and its cathode connected to the output terminal 5, and by a second diode 6*b*, with its anode connected to the output terminal 5 and its cathode connected to the input terminal 3.

The main problem of circuit architectures of the above sort is represented by the long start-up time required for supply of a stable reference signal $V_{REF}$ to the A/D converter 4, on account of the presence of the pair of diodes 6*a*, 6*b* connected in antiparallel configuration and of the high value of resistance provided thereby. The settling time of a configuration of this sort may be of minutes or even hours; before the end of the settling time, i.e., throughout the period of start-up of the circuit, proper functioning of the lowpass filter 1 cannot be guaranteed, just as likewise a stable reference voltage $V_{REF}$ cannot be guaranteed.

During the start-up time, there hence occurs inevitably an even marked degradation in the performance of the A/D converter and of the corresponding MEMS microphone.

Only at the end of the long start-up time, does the voltage on the output terminal 5 stabilize at the desired reference value.

Clearly, such long delay times cannot be for example accepted in the common situations of use of the MEMS microphone, when instead it is necessary to guarantee the nominal performance with extremely short delays, both upon switching-on of a generic electronic device incorporating the MEMS microphone and upon return from a so-called "power-down" condition (during which the device itself is partially turned off to provide a condition of energy saving).

BRIEF SUMMARY

The present disclosure provides a reference signal generator circuit for an analog-to-digital converter, in particular an acoustic transducer, that will enable the above-referenced drawbacks to be overcome.

In accordance with one aspect of the present disclosure, a reference signal generator circuit for an analog-to-digital converter is provided. The circuit includes a signal-generation stage structured to generate a first reference signal on a first reference terminal; a filtering circuit arranged between the first reference terminal and a second reference terminal and structured to be connected to the analog-to-digital converter, the filtering circuit structured to determine a filtering of disturbance present on the first reference signal and to supply at output on the second reference terminal a filtered reference signal; the reference signal generator circuit comprising a switch circuit structured to be actuated so as to connect the first reference terminal to the second reference terminal directly during startup of the reference signal generator circuit and then through the filtering circuit once startup is terminated.

In accordance with another aspect of the present disclosure, an electronic device is provided that includes an analog-to-digital converter and a reference signal generator circuit structured to supply a filtered reference signal to a reference input of the analog-to-digital converter, the reference signal generator circuit structured as described in the preceding paragraph.

In accordance with yet a further aspect of the present disclosure, a method for generating a reference signal adapted for use in an analog-to-digital converter is provided. The method includes the steps of generating a first reference signal on a first reference terminal; and filtering any disturbance present on the first reference signal by a filtering circuit arranged between the first reference terminal and a second reference terminal and structured to be connected to the analog-to-digital converter for supplying at output on the second reference terminal a filtered reference signal; connecting the first reference terminal to the second reference terminal directly during a step of startup of the generation of the reference signal; and connecting the first reference terminal to the second reference terminal through the filtering circuit once the startup step is terminated so as to enable the step of filtering of disturbance present on the first reference signal.

In accordance with yet another aspect of the present disclosure, a circuit is provided that includes a signal generator that generates a first reference signal at a first node; a filter circuit that receives the first reference signal at the first node and generates a filtered reference signal at a second node; and a switch circuit coupled to the filter circuit and structured, in response to a first control signal, to selectively connect the signal generator directly to the second node to bypass the filter circuit during a startup of the circuit and then to connect the filter circuit to the first and second nodes to filter the first reference signal following the startup of the circuit.

In accordance with another aspect of the foregoing circuit, a buffer circuit is provided that is coupled to the second node to receive the filtered reference signal at a single-stage amplifier in voltage-follower configuration in the buffer and to drive at output a capacitive load coupled in parallel to a compensation capacitor.

In accordance with still yet another aspect of the foregoing circuit, the filter circuit includes a first transistor coupled between the first and second nodes and structured to be actuated in a first operative condition of low-impedance conduction between the first and second nodes and in a second operative condition of high impedance between the first and second nodes, the filter circuit further comprising a second transistor in diode configuration coupled between the first and second nodes, and a control circuit coupled to the first transistor and structured to bias alternatingly a control terminal of the first transistor with a ground signal or the first reference signal to provide alternatingly the low-impedance connection or the high-impedance connection between the first and second nodes.

In accordance with yet another aspect of the foregoing circuit, the control circuit includes a comparator and a logic block, the comparator receiving on a first input the filtered reference signal and on a second input a comparison signal correlated to the first reference signal to define a threshold, and to supply at output a result of a comparison between the comparison signal and the filtered reference signal that is received at the logic block, the logic block structured to also receive the first control signal and to supply at output a second control signal to drive the first transistor in low-impedance conduction when the filtered reference signal drops below the threshold.

BRIEF DESCRIPTION OF THE SEVERAL VIEWS OF THE DRAWINGS

For a better understanding of the present disclosure, preferred embodiments thereof are now described, purely by way of non-limiting example and with reference to the annexed drawings, wherein.

DETAILED DESCRIPTION

Figure 1:
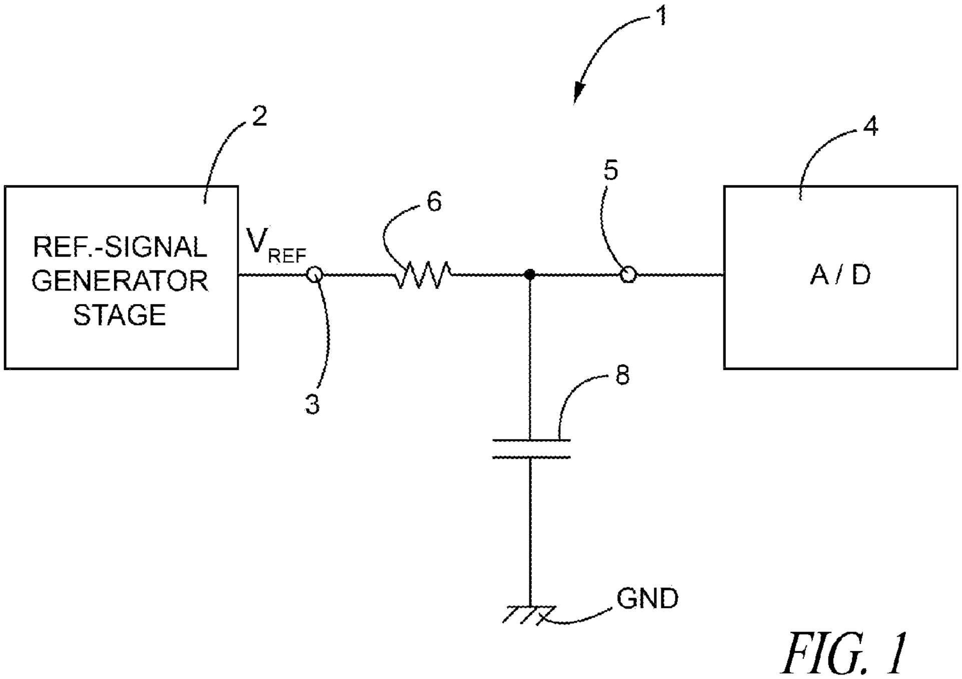
FIG. 1 (Prior Art)
FIG. 1 shows a lowpass filter of a known type, designed to filter a noisy reference signal for an analog-to-digital converter generated by a reference signal generator circuit.
Figure 2:
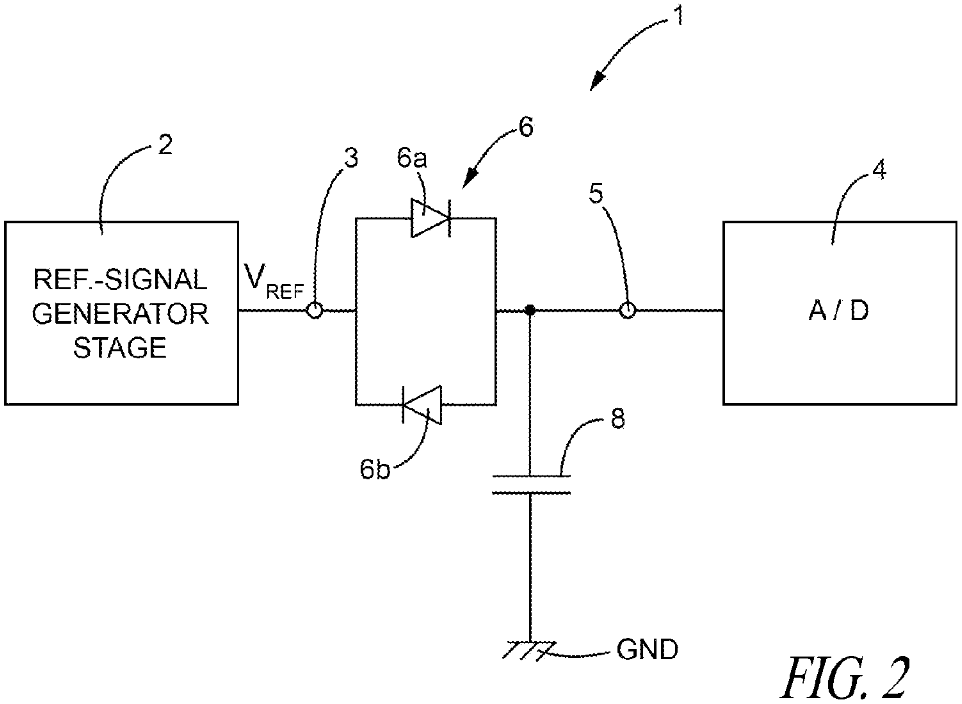
FIG. 2 (Prior Art)
FIG. 2 shows an embodiment of a known type of the lowpass filter of FIG. 1.
Figure 3:
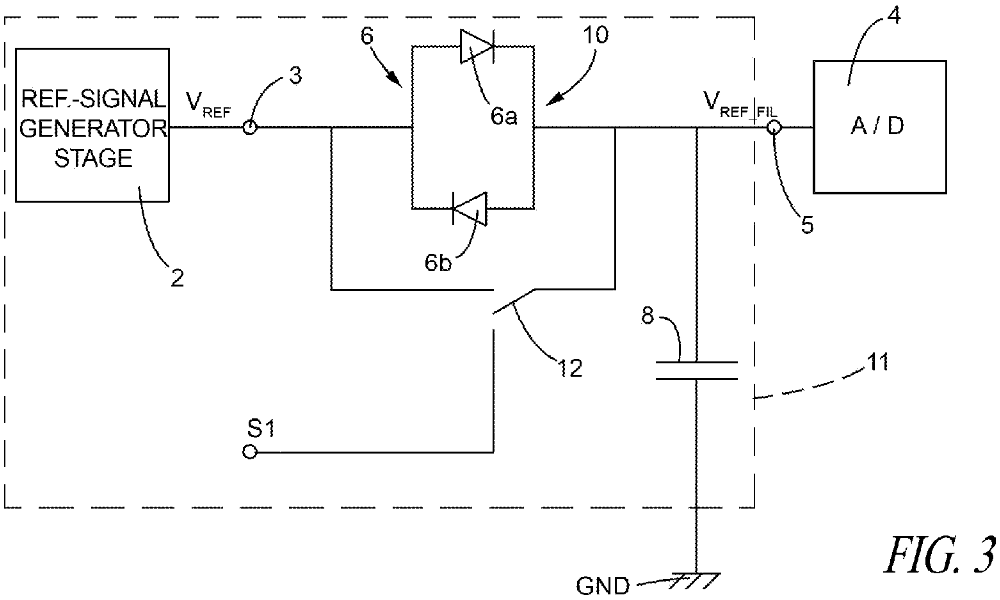
FIG. 3 shows an embodiment of a reference signal generator circuit having an integrated lowpass filter according to one embodiment of the present disclosure.

In FIG. 3 an improved reference signal generator circuit 11 is provided in accordance with one aspect of the present disclosure and which includes a filter 10 of a lowpass type in RC configuration. Elements of the filter 10 that are similar to elements already described with reference to FIGS. 1 and 2 are designated by the same reference numbers. The filter 10 is configured for receiving on the input terminal 3 a noisy reference signal $V_{REF}$ and for generating at output on the output terminal 5 a filtered reference signal $V_{REF\_FIL}$.

The noisy reference signal $V_{REF}$ can be generated by a reference signal generator circuit 2 of a known type, for example a generator of a band-gap type. In this case, the filter 10 is connected via its own input terminal 3 to the output of the reference signal generator circuit 2.

Unlike filters of a known type (such as the one illustrated in FIG. 1), the embodiment of the filter 10 envisages use of a turning-on switch 12, connected in parallel to the filter resistor 6, and can be actuated selectively to provide a low-impedance direct connection between the input terminal 3 and the output terminal 5 of the filter 10. In particular, the turning-on switch 12, receives an appropriate control signal 51 from a control logic (not shown), for example having appropriate counters or timers, in such a way as to be closed during a step of start-up of the filter 10, thus guaranteeing a rapid settling of the voltage values of the output terminal 5, and in such a way as to be open during a next step of normal operation of the filter 10, thus guaranteeing proper operation of filtering of the noisy reference signal $V_{REF}$. The start-up step terminates when the output terminal 5 of the filter 10 has reached the desired voltage, i.e., when the filter capacitor 8 is completely charged.

It has been found that, in order to limit the introduction of noise or parasitic signals by the filter 10, it is expedient not to introduce parasitic junctions connected to the output terminal 5. A parasitic junction connected, for example, between the output terminal 5 and the ground terminal GND could in fact shift significantly the working point of the filter 10, causing a variation of the voltage value of the noisy reference signal $V_{REF}$ and/or a variation of the cutoff frequency.

Figure 4:
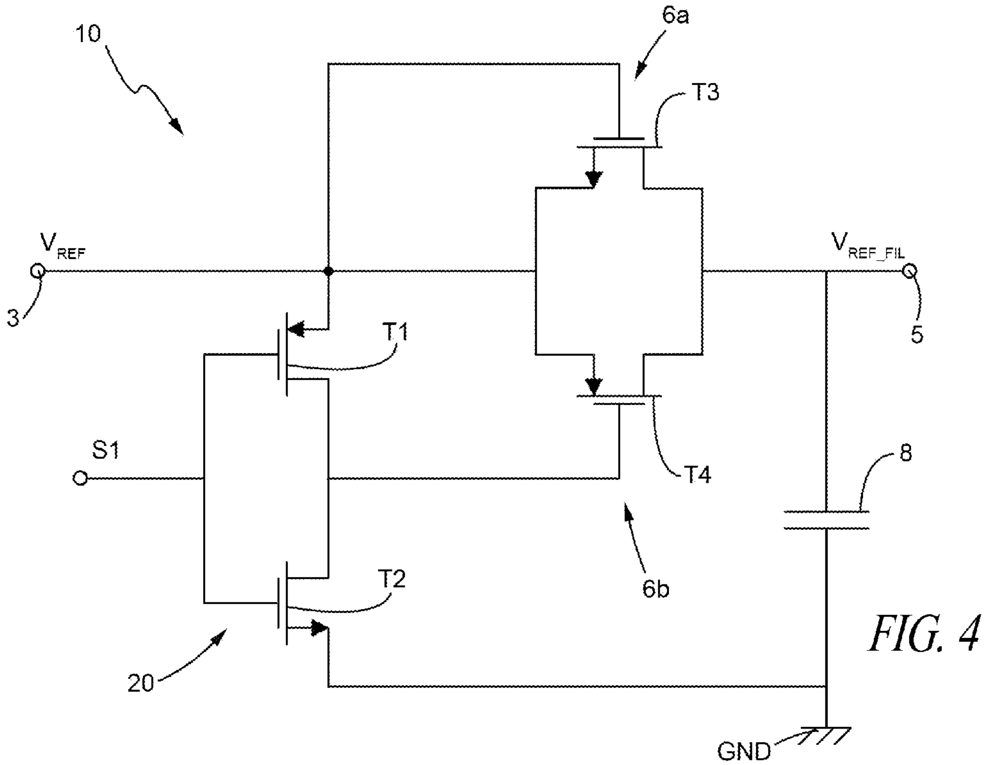
FIG. 4 shows an embodiment of the lowpass filter of the reference signal generator circuit of FIG. 3.

FIG. 4 shows a circuit diagram of a possible embodiment of the filter 10 of FIG. 3 in a completely integrated form.

The filter 10 includes an inverter stage 20, which includes a transistor T1, for example a P-type MOSFET, and a transistor T2, for example an N-type MOSFET. The transistors T1 and T2 are driven in conduction and inhibition by means of the control signal S1. In greater detail, the transistor T1 is connected, via its own source terminal, to the input terminal 3 and, via its own drain terminal, to a drain terminal of the transistor T2. The source terminal of the transistor T2 is, instead, connected to the ground terminal GND.

The filter 10 further includes a pair of transistors T3 and T4, in diode configuration, i.e., having a gate terminal of their own connected to a source terminal of their own. In particular, the gate terminal of the transistor T4 is connected to the source terminal of the transistor T4 itself via the transistor T1.

In greater detail, the transistors T3 and T4 include a respective source terminal connected to the input terminal 3 and a respective drain terminal connected to the output terminal 5. The transistors T3 and T4 are consequently connected in parallel to one another.

Finally, the filter capacitor 8 is connected between the output terminal 5 and the ground terminal GND, thus providing the lowpass filter.

Figure 5:
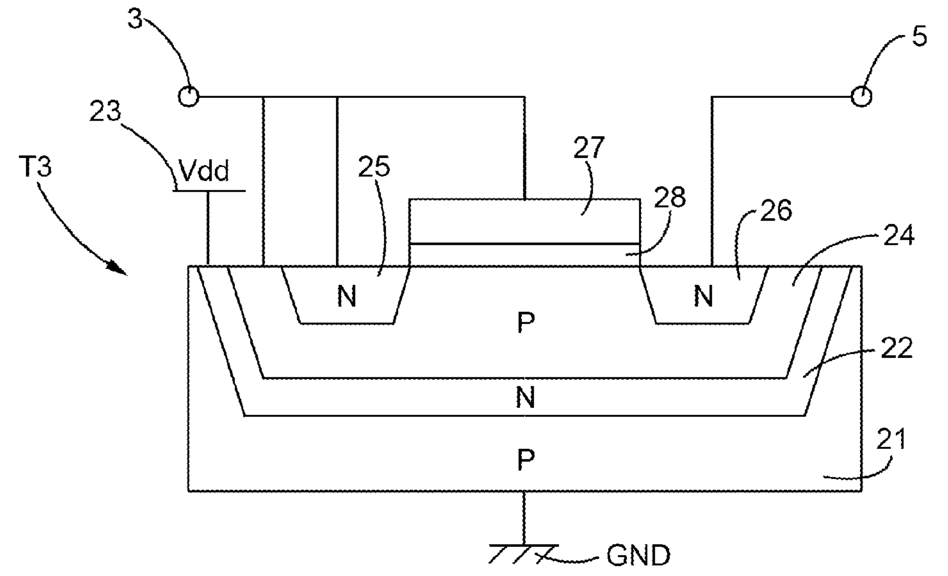
FIG. 5 shows an embodiment of a diode-connected transistor of the lowpass filter of FIG. 4.

Whereas the transistors T1, T2 and T4 can be generic transistors, in order to eliminate (or in any case limit considerably) parasitic junctions between the output terminal 5 and the ground terminal GND, the transistor T3 advantageously includes an insulation layer, which is biased at a voltage value Vdd, for example included between 1 V and 5 V, preferably equal to 1.8 V, and is designed to electrically insulate the transistor T3 from the substrate in which the transistor (as well as, in general, the components of the filter 10 described) are formed. FIG. 5 shows a cross-sectional view of a transistor T3, of a MOSFET type, designed for this purpose.

As illustrated in FIG. 5, the transistor T3 includes: a substrate 21, of a P type, connected to the ground terminal GND; an insulation region 22, of an N type, set in contact with the substrate 21 and electrically connected to a biasing terminal 23, configured for biasing the insulation region 22 at the voltage Vdd; a well region 24, of a P type, insulated from the substrate 21 via the insulation region 22; a source region 25, of an N type, formed in the well region 24 and connected to the input terminal 3; a drain region 26, of an N type, formed in the well region 24 and connected to the output terminal 5; and a gate region 27, connected to the input terminal 3 and insulated from the well region 24 by means of a dielectric region 28.

As may be noted in FIG. 5, the diode configuration envisages that the gate region 27, the source region 25, and the well region 24 are connected together.

To return to FIG. 4, during the step of start-up of the filter 10, the control signal S1 drives in conduction the transistor T2 and in inhibition the transistor T1. In this way, the transistor T4, of a P type, is biased in conduction by the signal coming from the ground terminal GND, setting in direct connection at low impedance the input terminal 3 with the output terminal 5 so as to charge the filter capacitor 8.

When the voltage value of the filtered reference signal $V_{REF\_FIL}$ on the output terminal 5, i.e., the voltage on the filter capacitor 8, equals the voltage value of the noisy reference signal $V_{REF}$ (for this purpose, if the time necessary to charge the filter capacitor 8 is known, it may be advantageous to use a digital timer), the control signal S1 switches, driving the transistor T1 in conduction and the transistor T2 in inhibition. Consequently, the voltages $V_{GS}$ between the gate terminal and the source terminal of the transistor T4 and of the transistor T3 are substantially the same as one another and equal to 0 V, and the transistors T3 and T4 are both turned off and provide the first diode 6*a* and the second diode 6*b*. Note therefore that the transistor T4 provides, in use, both the turning-on switch 12 and the second diode 6*b*.

Figure 6:
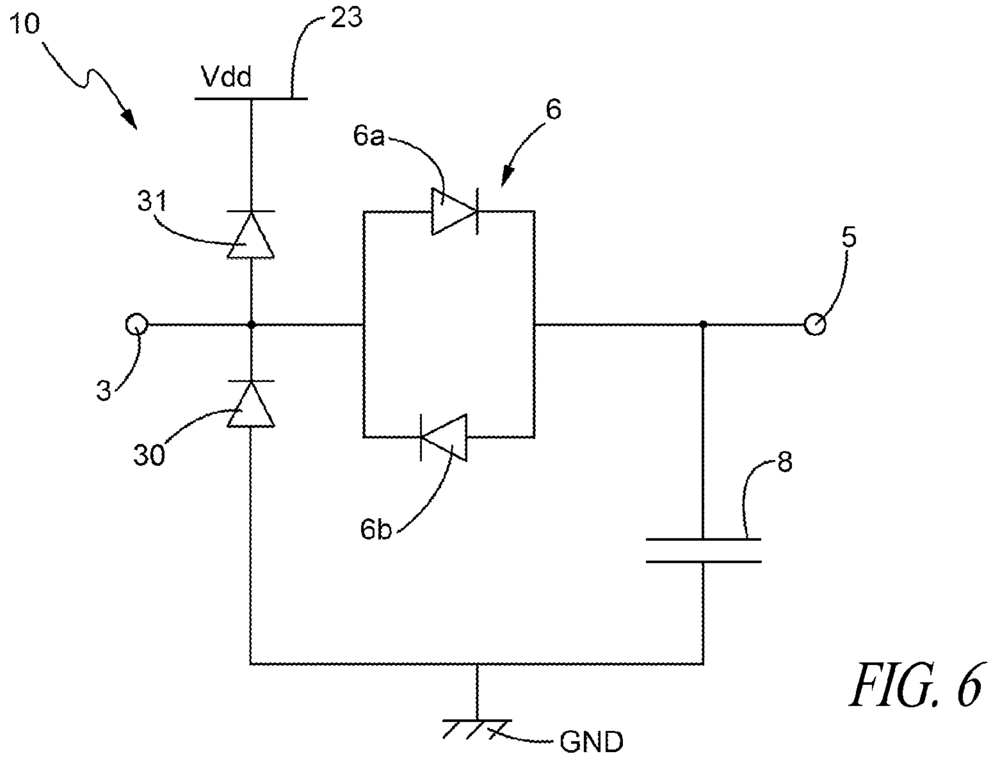
FIG. 6 shows an equivalent scheme of operation of the lowpass filter of FIG. 5.

FIG. 6 shows an equivalent scheme during a functioning step of the filter of FIG. 4 in which a first parasitic element 30 and a second parasitic element 31, in particular two parasitic diodes, generated inside the transistors T3 and T4, are shown.

The transistor T4, of a known type, is formed by a substrate of a P type, common to the substrate 21 of the transistor T3 of FIG. 5 and hence connected to the ground terminal GND, and by a well region thereof of an N type, in which the drain and source regions of the transistor T4 are formed. The well region hence forms with the substrate a PN junction connected between the input terminal 3 and the ground terminal GND. The PN junction is indicated in FIG. 6 as a first parasitic element 30.

Likewise, with reference to FIG. 5, the insulation region 22 and the well region 24 of the transistor T3 provide a PN junction connected between the input terminal 3 and the biasing terminal 23. The PN junction is represented in FIG. 6 as a second parasitic element 31.

The first and second parasitic elements 30, 31 are consequently advantageously connected to the input terminal 3 of the filter 10 and not to the output terminal 5, without causing in this way the problems discussed previously in this regard.

By appropriately sizing the transistors T3 and T4, it is possible to define precisely at what frequency to introduce the pole of the filter 10. For example, if the channel length L of the transistors T3 and T4 is fixed, it is possible to vary the channel width W. In particular, by increasing the value of channel width W, the transistors T3 and T4 are more conductive, and the pole of the filter shifts to higher frequencies; instead, by reducing the channel width W, the transistors T3 and T4 are less conductive, and the pole of the filter shifts to lower frequencies.

If the filtered reference signal $V_{REF\_FIL}$ generated by the reference signal generator circuit 11 is used for charging the capacitances, as for example occurs in the case where the reference signal generator circuit 11 is connected to an A/D converter 4, the latter being provided with the switched-capacitor technique, it is expedient to set a buffer circuit between the reference signal generator circuit 11 and the A/D converter 4 in order to be able to drive the capacitive load.

The buffer circuit is advantageously provided in such a way as to have an input impedance higher than that of the filter 10 in order not to degrade the performance of the latter, in particular in terms of noise and hence of precision of the reference voltage value achieved.

Figure 7:
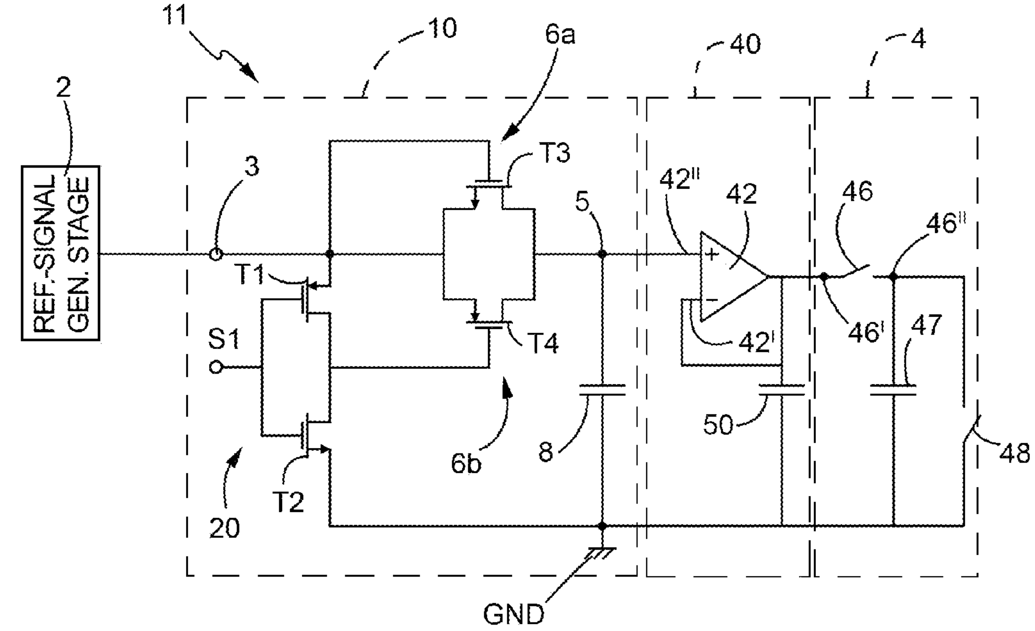
FIG. 7 shows the reference signal generator circuit of FIG. 3 further having a driver buffer for a capacitive load.

FIG. 7 shows a reference signal generator circuit 11 having a buffer circuit 40, in turn having an amplifier device 42, for example a single-stage amplifier in CMOS technology. The amplifier device has an inverting terminal 42' and a non-inverting terminal 42". The non-inverting terminal 42" is connected to the output terminal 5 of the filter 10, whilst the inverting terminal 42' is connected to the output terminal of the amplifier device 42, in voltage-follower configuration.

In general, a buffer circuit introduces noise on the signal that it generates at output; in particular, the voltage noise introduced by a buffer circuit having a single-stage amplifier, such as, for example, the buffer circuit 40, is given by formula (1):

$$V_{NOISE\_BUFF} = \sqrt{\frac{2KT \cdot \gamma}{C_{LOAD\_TOT}}} \tag{1}$$

where γ is the noise factor of the MOSFETs of the amplifier device 42, K is Boltzmann constant, T is the temperature expressed in Kelvin, and $C_{LOAD\_TOT}$ is the total capacitance seen at output from the amplifier device 42.

Hence, it is clear that by increasing the capacitive load it is possible to reduce further the noise introduced, typically at the expense of a higher current consumption.

FIG. 7 shows an input stage of the A/D converter 4 represented schematically as a generic switched-capacitance capacitive load, driven by the buffer circuit 40 and having: a first load switch 46, having a first terminal 46' and a second terminal 46", and connected to the output of the amplifier device 42 via the first terminal 46; a load capacitor 47, having value of capacitance $C_{LOAD}$, connected between the second terminal 46" of the first load switch 46 and the ground terminal GND; and a second load switch 48, connected in parallel to the load capacitor 47.

On the basis of formula (1), in order to reduce the voltage noise introduced by the buffer circuit 40, the buffer circuit 40 further includes a compensation capacitor 50, having a value of capacitance $C_{COMP}$, connected between the output of the amplifier device 42 and the ground terminal GND. The value of capacitance $C_{LOAD\_TOT}$ according to formula (1) is consequently given by $C_{LOAD\_TOT}=C_{COMP}+C_{LOAD}$.

Consequently, as emerges from formula (I) above, by choosing appropriately the value of capacitance $C_{COMP}$ it is possible to keep the noise generated by the buffer circuit 40 within the desired limits. There exists, however, a problem of capacitive coupling between the input and the output of the amplifier device 42. When the first load switch 46 is driven in conduction, the output voltage of the buffer circuit 40 goes to a voltage lower than the voltage value of the filtered reference signal $V_{REF\_FIL}$ on account of the charge partition between the compensation capacitor 50 and the load capacitor 47, and then returns to the value of the voltage of the filtered reference signal $V_{REF\_FIL}$ after a period of transient that depends upon the characteristics of the amplifier device 42. This disturbance appears, attenuated, also at the input of the buffer circuit 40, on account of the capacitive coupling between the inputs 42' and 42" of the amplifier device 42. The effect of the coupling is, however, the smaller, the greater the value of capacitance of the filter capacitor 8.

During a transient period, following upon closing of the first load switch 46, the compensation capacitor 50 discharges; on account of the capacitive coupling also the filter capacitor 8 discharges, and the load capacitor 47 charges; consequently, the first and second diodes 6*a* and 6*b* of the filter 10 are subjected to a voltage such as to cause a current to flow through them, which charges the filter capacitor 8 again. On account of the combined action of the buffer circuit 40, which tends to re-establish the voltage on its output at the value prior to closing of the load switch 46, and on account of the charge that flows to the filter capacitor 8 via the first and second diodes 6*a* and 6*b*, during the period of transient, the voltage value of the filtered reference signal $V_{REF\_FIL}$ increases beyond the voltage value of the noisy reference signal $V_{REF}$, until a point of equilibrium is reached in which the mean transfer of charge through the diodes 6*a* and 6*b* is zero. This effect, which is undesirable, can be reduced by increasing one or all from among the value of capacitance $C_{COMP}$ of the compensation capacitor 50, the value of capacitance $C_{LOAD}$ of the load capacitor 47, and the passband of the buffer circuit 40 (by increasing the current supplied to the amplifier device 42) or in any case by speeding up its settling time, in a way in itself known.

A particularly advantageous implementation envisages the use of a single-stage amplifier, functioning in class AB (for example, of the type illustrated and described in A. J. Lòpez-Martin, S. Baswa, J. Ramirez-Angulo, R. G. Carvajal, "Low-VoltageSuper Class AB CMOS OTA Cells With Very High Slew Rate and Power Efficiency", IEEE Journal of Solid-State Circuits, but other single-stage amplifiers of a known type can be used). It is thus possible to contain the noise on the reference and at the same time minimize the effects of the kick-back voltage of the load, which occurs in several A/D converters, with a reduced current consumption.

In this way, it is moreover possible to provide a filter 10 with a drop across it in the region of a few millivolts, which in percentage terms does not present a marked impact upon the performance of the system in which the filter 10 operates, provided that the reference voltage is sufficiently high (for example 1V or more).

Figure 8:
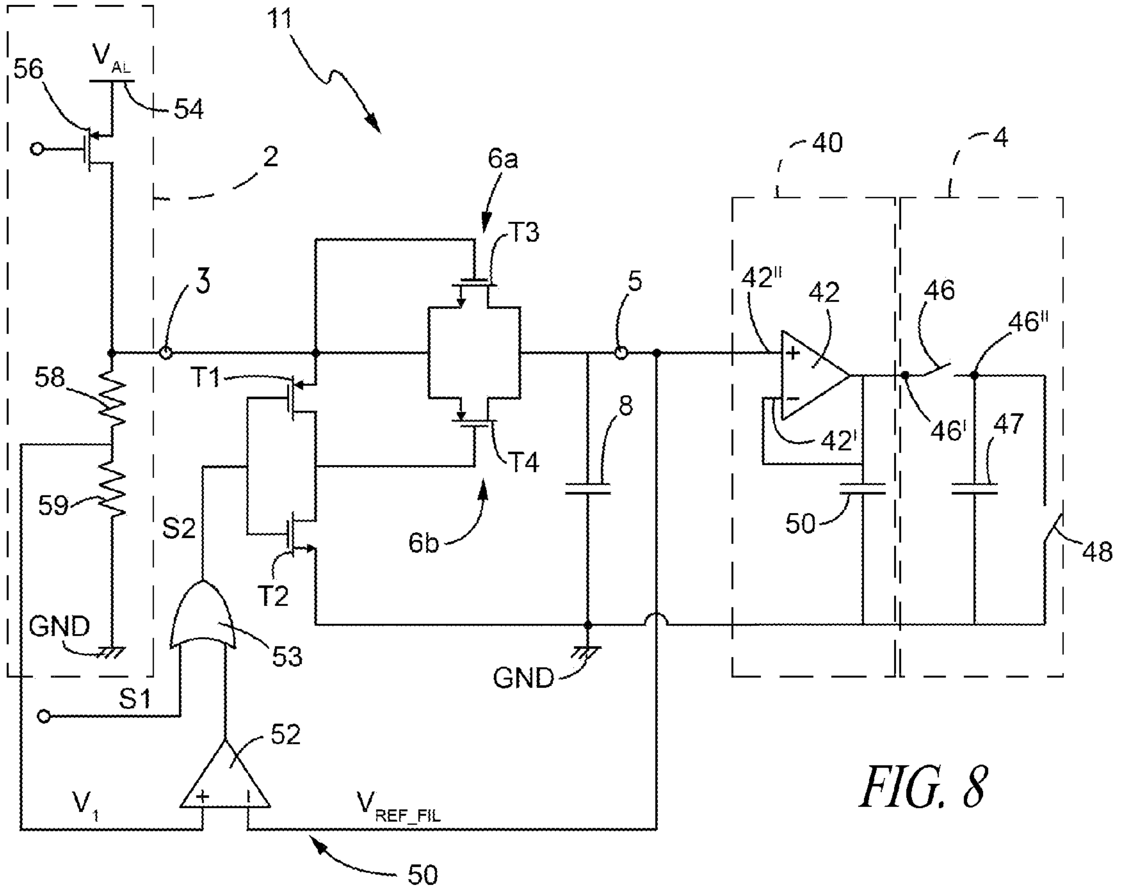
FIG. 8 shows the reference signal generator circuit of FIG. 7 further having a feedback loop for stabilization of the reference signal.

Finally, as illustrated in FIG. 8, it is possible to add to the reference signal generator circuit 11*a* control loop 51, having a comparator device 52 and an OR logic 53, capable of resetting the filter 10 in the case where the voltage value of the filtered reference signal $V_{REF\_FIL}$ on the output of the filter 10 drops below a certain limit, for example by a value included between 1% and 10% of the voltage value of the reference signal $V_{REF}$.

FIG. 8 shows a reference signal generator circuit 11 in which the reference signal generator circuit 2 is represented schematically by showing exclusively an output stage of a bandgap circuit of a known type, and includes: a supply terminal 54, supplied at a supply voltage $V_{AL}$; a transistor 56, belonging to a current mirror of the output stage of the bandgap circuit, having a first terminal of its own connected to the supply terminal 54 and a second terminal of its own connected to the input terminal 3 of the filter 10; a first reference resistor 58, having a first terminal of its own connected to the input terminal 3 of the filter 10; and a second reference resistor 59, having a first terminal of its own connected to a second terminal of the first reference resistor 58 and a second terminal of its own connected to the ground terminal GND, the first and second reference resistors 58, 59 hence providing a resistive divider.

The comparator device 52 of the control loop 51 receives on a first input thereof the filtered reference signal $V_{REF\_FIL}$ (as present on the output terminal 5 of the filter 10) and on a second input thereof a comparison voltage $V_1$, correlated to the noisy reference voltage $V_{REF}$, and in particular obtained by taking the partition voltage present on the first terminal of the second reference resistor 59. The comparison voltage $V_1$ is consequently lower than the noisy reference voltage $V_{REF}$, and its value (for example included in the 10-100 mV range) depends upon the value of resistance chosen for the first and second reference resistors 58, 59.

After the comparator device 52 has performed the operation of comparison between the voltage value of the noisy reference signal $V_{REF}$ and the comparison voltage $V_1$, it generates at output a binary signal, which is supplied on a first input of the OR logic 53. The OR logic 53 receives on a second input thereof the control signal S1, which is, for example, also of a binary type, and generates at output a further control signal S2.

In normal operating conditions, the control signal S1 has a low logic value, the voltage value of the filtered reference signal $V_{REF\_FIL}$ does not drop below the threshold value defined by the comparison voltage $V_1$ and the logic value of the control signal S2 is equal to the logic value of the control signal S1. With reference to FIG. 3, in this condition the turning-on switch 12 is driven in inhibition. If the voltage value of the filtered reference signal $V_{REF\_FIL}$ drops below the threshold value defined by the comparison voltage $V_1$, the signal generated by the comparator device 52 has a high logic value, and consequently also the control signal S2 acquires a high logic value. In this case, the transistor T4 (i.e., with reference to FIG. 3, the turning-on switch 12) is driven in conduction, and the voltage on the filter capacitor 8 (i.e., the voltage on the output terminal 5 of the filter 10) is brought to the appropriate value by means of the low-impedance connection with the input terminal 3.

It is evident that, by varying the value of resistance of the first and second reference resistors 58, 59, it is possible to vary the comparison voltage value $V_1$, consequently varying the comparison threshold of the comparator device 52.

The characteristics previously listed render use of the reference signal generator circuit 11 within a MEMS microphone 90 particularly advantageous.

Figure 9:
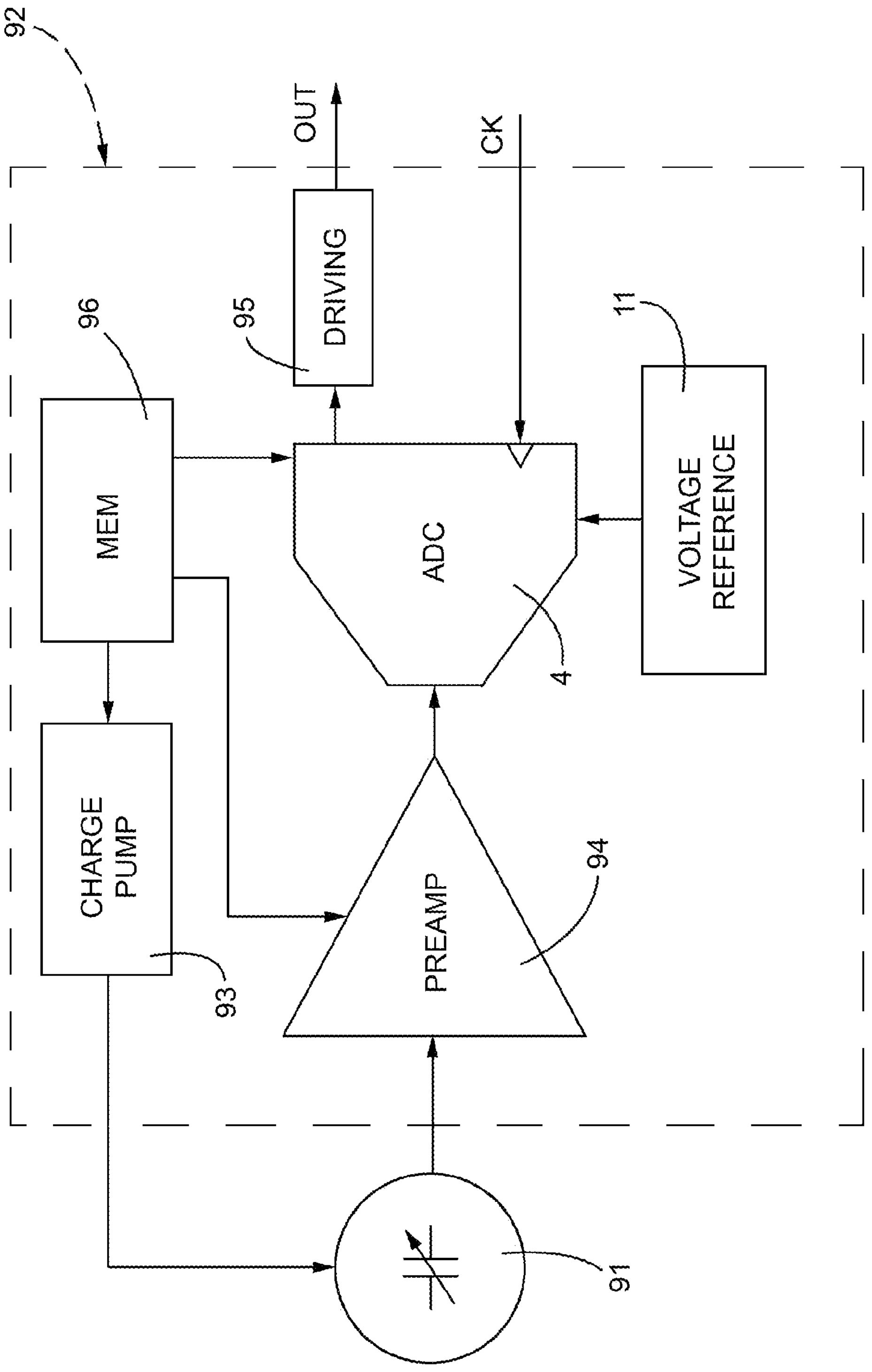
FIG. 9 shows a block diagram of a MEMS microphone, which includes the reference signal generator circuit of FIG. 7 or FIG. 8.

As illustrated in FIG. 9, a MEMS microphone 90 includes two different blocks: a mechanical block 91, basically constituted by the sensor sensitive to the acoustic stimuli (provided by at least two electrodes, one of which is mobile), and a signal-processing block 92 (ASIC) configured for biasing correctly the sensor and for appropriately processing the electrical signal generated by the sensor so as to produce on an output of the MEMS microphone 90 a digital signal that can be processed, for example, by a microcontroller (not shown), designed for the purpose.

The signal-processing block 92 in turn includes a plurality of functional sub-blocks. In particular, the signal-processing block 92 includes: a charge pump 93, which enables generation of an appropriate voltage for biasing the sensor of the mechanical block 91; a preamplifier 94, designed to amplify the electrical signal generated by the sensor; the analog-to-digital converter 4, for example, of a sigma-delta type, configured for receiving the electrical signal amplified by the preamplifier 94, of an analog type, and convert it into a digital signal; the reference signal generator circuit 11 according to the present disclosure, connected to the analog-to-digital converter 4; and a driver 95, designed to function as interface between the analog-to-digital converter 4 and an external system, for example a microcontroller.

Furthermore, the MEMS microphone 90 can include a memory 96 (either volatile or nonvolatile), for example, programmable from outside so as to enable use of the MEMS microphone 90 according to different configurations (for example, of gain).

Figure 10:
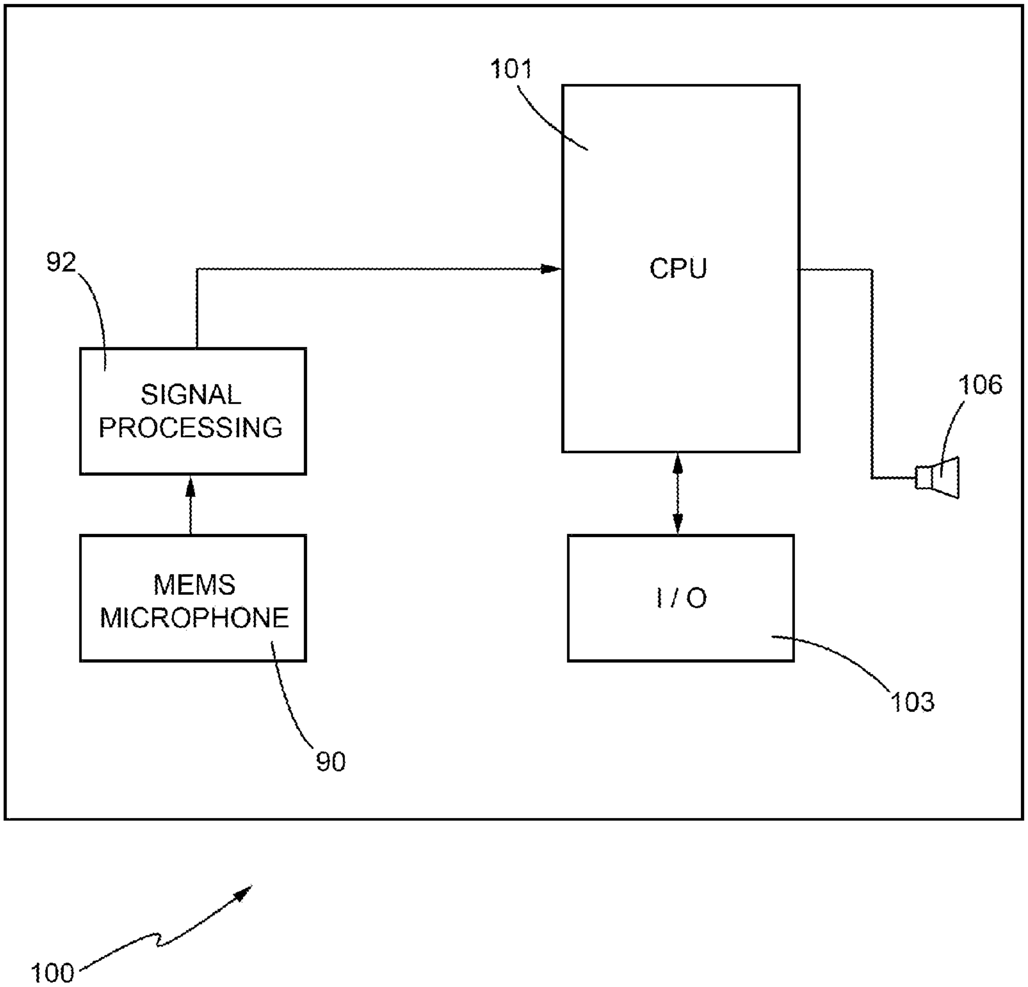
FIG. 10 shows an electronic device in which the reference signal generator circuit according to the present disclosure can be used.

The characteristics previously listed render use of the reference signal generator circuit 11 and of the MEMS microphone 90 in which the reference signal generator circuit 11 is implemented particularly advantageous in an electronic device 100, as illustrated in FIG. 10 (the electronic device 100 can possibly include further MEMS microphones, in a way not illustrated). The electronic device 100 is preferably a mobile-communication device, such as for example a cellphone, a PDA, a notebook, but also a voice recorder, a reader of audio files with voice-recording capacity, etc. Alternatively, the electronic device 100 can be a hydrophone, capable of working under water, or else a hearing-aid device.

The electronic device 100 includes a microprocessor 101 and an input/output interface 103, for example provided with a keyboard and a video, which is also connected to the microprocessor 101. The MEMS microphone 90 communicates with the microprocessor 101 via the signal-processing block 92. Furthermore, a loudspeaker 106 may be present, for generating sounds on an audio output (not shown) of the electronic device 100.

From an examination of the characteristics of the present disclosure the advantages that it affords are evident.

In particular, the reference signal generator circuit 11 according to the present disclosure has a reduced switching-on time, of the order of approximately 10 ms, a contained consumption, and supplies at output a filtered reference signal $V_{REF\_FIL}$ (which can, for example, be used as reference signal for an analog-to-digital converter) characterized by low noise, in particular in the audio band, and with driver capacity (for example for a switched-capacitance load).

In addition, since it has a reduced area, the circuit can be completely integrated in CMOS technology.

The characteristics hence render use of the reference signal generator circuit 11 particularly advantageous in an analog-to-digital converter of a sigma-delta type.

However, the present disclosure can be used with an analog-to-digital converter of any type.

Finally, it is clear that modifications and variations may be made to what has been described and illustrated, herein without thereby departing from the sphere of protection of the present disclosure, as defined in the annexed claims.

In particular, it is evident that the reference signal generator 11 according to the present disclosure can be used for other applications in which the use of a filtered reference signal having the characteristics highlighted previously is required, and moreover that the analog-to-digital converter, which uses the reference signal generator, can be used in other applications and in combination with other electronic circuits and devices, in which the noise must be attenuated in a band that does not include d.c.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A reference signal generator circuit, comprising:

a first reference terminal and a second reference terminal, the first reference terminal structured to receive a first reference signal;

a filtering circuit arranged between the first reference terminal and the second reference terminal, the filtering circuit structured to filter a disturbance on the first reference signal and to supply at output on the second reference terminal a filtered reference signal, the filtering circuit including a first diode element and a first switch circuit each coupled between the first and second reference terminals;

a control circuit structured to actuate the first switch circuit in a first operative condition of low-impedance conduction in which the first switch circuit constitutes a low-impedance coupling between the first reference terminal to the second reference terminal during startup of the reference signal generator circuit and in a second operative condition of high impedance in which the first switch circuit acts as a second diode element in antiparallel with the first diode element and provides a high-impedance connection between the first reference terminal and the second reference terminal once startup is terminated.

2. The circuit of claim 1, wherein the first switch circuit includes a first transistor in diode configuration and the first diode element is a second transistor in diode configuration.

3. The circuit of claim 2, wherein the control stage includes a third transistor and a fourth transistor coupled in inverter configuration, the third and fourth transistors structured to be alternatively controlled in conduction and inhibition by a first control signal and structured to bias alternatively a control terminal of the first transistor with a ground signal or with the first reference signal to provide alternatively the low-impedance conduction or the high-impedance conduction between the first reference terminal and the second reference terminal.

4. The circuit of claim 2, further comprising a control loop structured to drive the first transistor in low-impedance conduction when the filtered reference signal presents a given relation with a threshold.

5. The circuit of claim 4, wherein the control loop includes a comparator device and a logic block, the comparator device having a first input terminal, a second input terminal, and an output terminal, the comparator device structured to receive on the first input terminal the filtered reference signal and on the second input terminal a comparison signal correlated to the first reference signal to define the threshold and to supply on the output terminal a result of a comparison between the comparison signal and the filtered reference signal, and the logic block having a first input terminal, a second input terminal, and an output terminal, the logic block structured to receive on the first input terminal the result of the comparison and on the second input terminal the first control signal, and to supply on the output terminal a second control signal that is adapted to drive the first transistor in low-impedance conduction when the filtered reference signal drops below the threshold.

6. The circuit of claim 1, wherein the circuit includes a filter capacitor coupled to the second reference terminal, and wherein the first switch element and the filter capacitor are structured to form a lowpass filter when the first switch element is in high impedance conduction.

7. A reference signal generator circuit, comprising:

a first reference terminal and a second reference terminal;

a signal-generation stage coupled to the first reference terminal;

a filtering circuit coupled between the first reference terminal and the second reference terminal;

a switch circuit coupled to the first and second reference terminals and in parallel with the filtering circuit; and a buffer circuit coupled to the second reference terminal and configured to be coupled to the capacitive load, the buffer circuit configured to drive the capacitive load; the buffer circuit including:

a single-stage amplifier in voltage-follower configuration and having a non-inverting input coupled to the filtering circuit, and a compensation capacitor coupled to an output terminal of the single-stage amplifier and configured to be coupled in parallel to the capacitive load.

8. The circuit of claim 7, wherein the filtering circuit includes a first high-impedance resistive element arranged between the first reference terminal and the second reference terminal, and wherein the switch circuit includes a first switch element connected in parallel to the first resistive element and structured to be actuated to short-circuit the first resistive element.

9. The circuit of claim 8, wherein the first resistive element includes a first diode element, and wherein the first switch element includes a first transistor, the reference signal generator circuit including a control stage structured to actuate the first transistor in a first operative condition of low-impedance conduction in which it provides a low-impedance connection between the first reference terminal and the second reference terminal to short-circuit the first diode element, and in a second operative condition of high impedance in which it provides a high-impedance connection between the first reference terminal and the second reference terminal.

10. The circuit of claim 9, wherein the first diode element is a second transistor in diode configuration connected between the first reference terminal and the second reference terminal.

11. The circuit of claim 10, wherein the control stage includes a third transistor and a fourth transistor that are coupled together to form an inverter, the third and fourth transistors alternatively controlled in conduction and inhibition by a first control signal and structured to bias alternatively a control terminal of the first transistor with a ground signal or with the first reference signal to provide alternatively the low-impedance connection or the high-impedance connection between the first reference terminal and the second reference terminal.

12. The circuit of claim 10, wherein the filtering circuit includes a filter capacitor connected to the second reference terminal, and the first transistor and the filter capacitor are coupled together to form a low pass filter when the first transistor is in the second operative condition of high-impedance.

13. An electronic device, comprising:

an analog-to-digital converter having an input terminal and an input stage that includes a capacitive load;

a reference signal generator circuit structured to supply a filtered reference signal to the input terminal of the analog-to-digital converter, the reference signal generator circuit including:

a first reference terminal and a second reference terminal;

a signal-generation stage structured to generate a first reference signal on the first reference terminal;

a filtering circuit coupled between the first reference terminal and the second reference terminal and further coupled to the analog-to-digital converter, the filtering circuit configured to filter a disturbance on the first reference signal and to supply at output on the second reference terminal a filtered reference signal; and a switch circuit coupled to the first reference terminal and to the second reference terminal; and a buffer circuit having an output terminal coupled to the analog-to-digital converter and structured to drive the capacitive load, the buffer circuit including a single-stage amplifier in voltage-follower configuration and having a non-inverting input structured to receive the filtered reference signal, and a compensation capacitor coupled to the output terminal of the buffer circuit and further coupled in parallel to the capacitive load.

14. The device of claim 13, including an acoustic transducer configured to generate an analog detection signal, and wherein the analog-to- digital converter is operatively coupled to the acoustic transducer and structured to convert the analog detection signal into a digital detection signal.

15. The device of claim 14, wherein the acoustic transducer is a MEMS microphone of a capacitive type, and the reference signal generator circuit is of a type integrated in CMOS technology.

16. The device of claim 13, wherein the electronic device is chosen from the group that includes: a cellphone, a PDA, a notebook, a voice recorder, an audio reader with voice-recorder function, a console for videogames, a hydrophone, a hearing-aid device.

17. A circuit, comprising:

first and second nodes;

a signal generator structured to generate a first reference signal at the first node;

a filter circuit coupled to the first node and structured to receive the first reference signal and to generate a filtered reference signal at the second node;

a first transistor coupled between the first and second nodes and structured to be actuated in a first operative condition of low-impedance conduction between the first and second nodes and in a second operative condition of high impedance conduction between the first and second nodes, the first transistor including a control terminal;

a second transistor in diode configuration coupled between the first and second nodes, the second transistor including a control terminal; and a switch circuit coupled to the first and second nodes and structured to selectively connect the signal generator directly to the second node to bypass the filter circuit, and to connect the filter circuit to the first and second nodes, the switch circuit including:

a control circuit coupled to the first transistor and structured to bias alternatingly the control terminal of the first transistor with a ground signal or the first reference signal to provide alternatingly the low-impedance conduction or the high-impedance conduction between the first and second nodes;

a comparator having a first input terminal configured to receive the filtered reference signal and a second input terminal configured to receive a comparison signal correlated to the first reference signal to define a threshold, and an output terminal, the comparator configured to supply on the output terminal a result of a comparison between the comparison signal and the filtered reference signal; and a logic block having a first input terminal, a second input terminal, and an output terminal, the logic block structured to receive a first control signal on the first input terminal, to receive the result from the comparator on the second input terminal, and to supply on the output terminal a second control signal to drive the first transistor in low-impedance conduction when the filtered reference signal drops below the threshold.

18. The circuit of claim 17, the circuit further including a buffer circuit coupled to the second node, the buffer circuit having a single-stage amplifier in voltage-follower configuration and structured to receive the filtered reference signal and to drive a capacitive load.

* * * * *